United States Patent
Lin et al.

(10) Patent No.: US 12,419,070 B2
(45) Date of Patent: Sep. 16, 2025

(54) SEMICONDUCTOR DEVICE INCLUDING III-V COMPOUND SEMICONDUCTOR LAYER AND MANUFACTURING METHOD THEREOF

(71) Applicant: UNITED MICROELECTRONICS CORP., Hsin-Chu (TW)

(72) Inventors: Da-Jun Lin, Kaohsiung (TW); Chih-Wei Chang, Tainan (TW); Fu-Yu Tsai, Tainan (TW); Bin-Siang Tsai, Changhua County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 648 days.

(21) Appl. No.: 17/833,885

(22) Filed: Jun. 6, 2022

(65) Prior Publication Data
US 2023/0352557 A1    Nov. 2, 2023

(30) Foreign Application Priority Data
Apr. 27, 2022    (TW) .................................. 111116030

(51) Int. Cl.
*H10D 30/01* (2025.01)
*H01L 21/265* (2006.01)
(Continued)

(52) U.S. Cl.
CPC ..... *H10D 30/015* (2025.01); *H01L 21/26546* (2013.01); *H01L 23/3171* (2013.01); *H10D 30/475* (2025.01); *H10D 62/824* (2025.01); *H10D 62/85* (2025.01); *H10D 62/8503* (2025.01); *H10D 64/01* (2025.01); *H10D 64/411* (2025.01); *H10D 64/62* (2025.01)

(58) Field of Classification Search
CPC .. H10D 30/015; H10D 30/475; H10D 62/824; H10D 62/85; H10D 62/8503; H10D 64/01; H10D 64/411; H10D 64/62; H10D 62/151; H10D 64/256; H10D 64/513; H01L 21/26546; H01L 23/3171; H01L 21/26553; H01L 21/28575
USPC ...................................................... 257/211
See application file for complete search history.

(56) References Cited

U.S. PATENT DOCUMENTS

9,142,636 B2 * 9/2015 Sheppard ............... H10D 30/47
9,165,851 B2   10/2015 Ozaki
(Continued)

*Primary Examiner* — Duy T Nguyen
(74) *Attorney, Agent, or Firm* — Winston Hsu (57) ABSTRACT

A manufacturing method of a semiconductor device includes the following steps. A III-V compound barrier layer is formed on a III-V compound semiconductor layer. A passivation layer is formed on the III-V compound barrier layer. A silicon layer is formed on the passivation layer, the III-V compound barrier layer, and the III-V compound semiconductor layer. A silicon implantation process is performed to the III-V compound semiconductor layer for forming a source doped region and a drain doped region in the III-V compound semiconductor layer under the silicon layer. A source electrode and a drain electrode are formed on the silicon layer. A source silicide layer is formed between the source electrode and the source doped region, and a drain silicide layer is formed between the drain electrode and the drain doped region. The source silicide layer and the drain silicide layer are partly formed on the passivation layer.

5 Claims, 7 Drawing Sheets

(51) Int. Cl.
   *H01L 23/31*    (2006.01)
   *H10D 30/47*    (2025.01)
   *H10D 62/824*   (2025.01)
   *H10D 62/85*    (2025.01)
   *H10D 64/01*    (2025.01)
   *H10D 64/27*    (2025.01)
   *H10D 64/62*    (2025.01)

(56) References Cited

U.S. PATENT DOCUMENTS

| | | | |
|---|---|---|---|
| 9,711,633 B2 * | 7/2017 | Sheppard | H10D 62/149 |
| 9,899,505 B2 * | 2/2018 | Radosavljevic | H10D 64/64 |
| 10,985,271 B2 | 4/2021 | Yang | |
| 11,081,579 B2 | 8/2021 | Chang | |
| 11,239,327 B2 | 2/2022 | Lee | |
| 11,264,492 B2 | 3/2022 | Huang | |
| 11,296,214 B2 | 4/2022 | Lee | |
| 2007/0158683 A1 * | 7/2007 | Sheppard | H10D 62/8325 |
| | | | 257/E21.057 |
| 2011/0018040 A1 | 1/2011 | Smith | |
| 2013/0001646 A1 * | 1/2013 | Corrion | H10D 64/513 |
| | | | 257/E21.403 |
| 2013/0256679 A1 * | 10/2013 | Yao | H10D 62/8503 |
| | | | 257/E29.246 |
| 2015/0243833 A1 * | 8/2015 | Desrues | H10F 77/211 |
| | | | 438/98 |
| 2017/0133518 A1 | 5/2017 | Li | |
| 2017/0170288 A1 | 6/2017 | Kiyosawa | |
| 2019/0157440 A1 | 5/2019 | Green | |

* cited by examiner

SEMICONDUCTOR DEVICE INCLUDING III-V COMPOUND SEMICONDUCTOR LAYER AND MANUFACTURING METHOD THEREOF

BACKGROUND OF THE INVENTION

1. Field of the Invention

The present invention relates to a semiconductor device and a manufacturing method thereof, and more particularly, to a semiconductor device including a III-V compound semiconductor layer and a manufacturing method thereof.

2. Description of the Prior Art

Because of the semiconductor characteristics, III-V semiconductor compounds may be applied in many kinds of integrated circuit devices, such as high power field effect transistors, high frequency transistors, or high electron mobility transistors (HEMTs). In the high electron mobility transistor, two semiconductor materials with different bandgaps are combined and heterojunction is formed at the junction between the semiconductor materials as a channel for carriers. In recent years, gallium nitride (GaN) based materials have been applied in the high power and high frequency products because of the properties of wider bandgap and high saturation velocity. Two-dimensional electron gas (2DEG) may be generated by the piezoelectricity property of the GaN-based materials, and the switching velocity may be enhanced because of the higher electron velocity and the higher electron density of the 2DEG. Therefore, how to further improve the electrical performance of transistors formed with III-V compound materials by modifying materials, structures and/or manufacturing methods has become a research direction for people in the related fields.

SUMMARY OF THE INVENTION

A semiconductor device and a manufacturing method thereof are provided in the present invention. The control over doped regions is improved by a silicon layer covering a III-V compound semiconductor layer in a silicon implantation process, and the silicon layer is also used for forming a silicide layer between an electrode and the doped region. Contact resistance may be reduced and related electrical performance of the semiconductor device may be enhanced accordingly.

According to an embodiment of the present invention, a manufacturing method of a semiconductor device is provided. The manufacturing method includes the following steps. A III-V compound barrier layer is formed on a III-V compound semiconductor layer. A passivation layer is formed on the III-V compound barrier layer. A silicon layer is formed on the passivation layer, the III-V compound barrier layer, and the III-V compound semiconductor layer. A silicon implantation process is performed to the III-V compound semiconductor layer for forming a source doped region and a drain doped region in the III-V compound semiconductor layer under the silicon layer. A source electrode and a drain electrode are formed on the silicon layer. A source silicide layer is formed between the source electrode and the source doped region and a drain silicide layer is formed between the drain electrode and the drain doped region. The source silicide layer and the drain silicide layer are partly formed on the passivation layer.

According to an embodiment of the present invention, a semiconductor device is provided. The semiconductor device includes a III-V compound semiconductor layer, a III-V compound barrier layer, a passivation layer, a source doped region, a drain doped region, a source electrode, a drain electrode, a source silicide layer, and a drain silicide layer. The III-V compound barrier layer is disposed on the III-V compound semiconductor layer. The passivation layer is disposed on the III-V compound barrier layer, and the passivation layer includes a first region and a second region. The second region is located above the first region, and a silicon concentration of the second region is higher than a silicon concentration of the first region. The source doped region and the drain doped region are disposed in the III-V compound semiconductor layer. The source electrode and the drain electrode are disposed on the source doped region and the drain doped region, respectively. The source silicide layer is disposed between the source electrode and the source doped region, and the drain silicide layer is disposed between the drain electrode and the drain doped region. The source silicide layer and the drain silicide layer are further disposed partly on the passivation layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-9 are schematic drawings illustrating a manufacturing method of a semiconductor device according to a first embodiment of the present invention, wherein

FIG. 11 and FIG. 12 are schematic drawings illustrating a manufacturing method of a semiconductor device according to a third embodiment of the present invention, wherein

FIG. 13 and FIG. 14 are schematic drawings illustrating a manufacturing method of a semiconductor device according to a fourth embodiment of the present invention, wherein

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "etch" is used herein to describe the process of patterning a material layer so that at least a portion of the material layer after etching is retained. When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
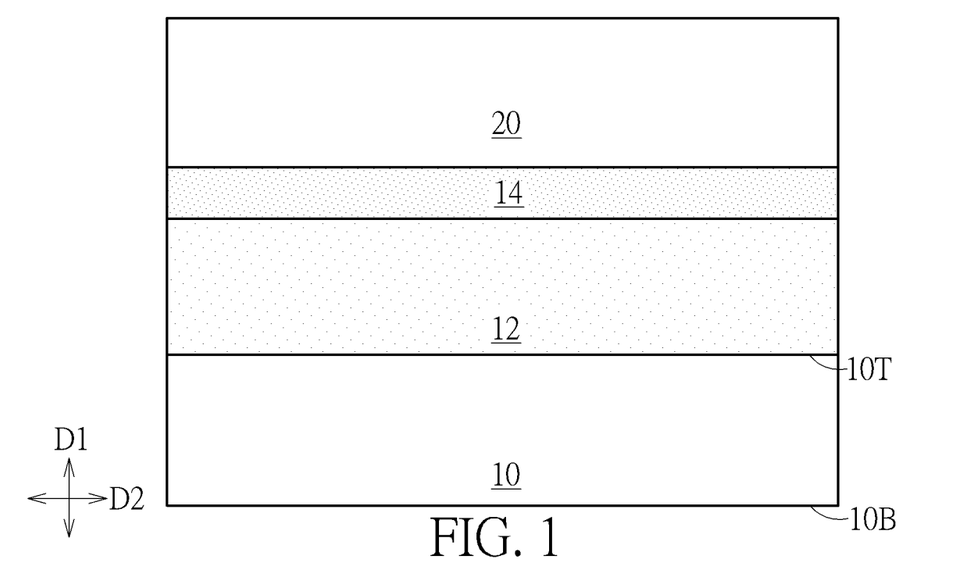
Figure 2:
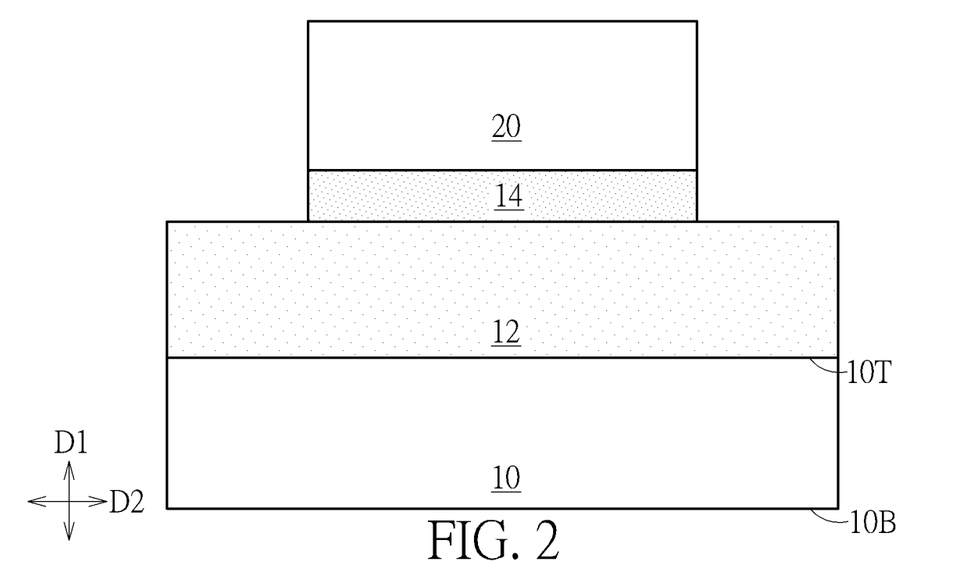
FIG. 2 is a schematic drawing in a step subsequent to FIG. 1.
Figure 3:
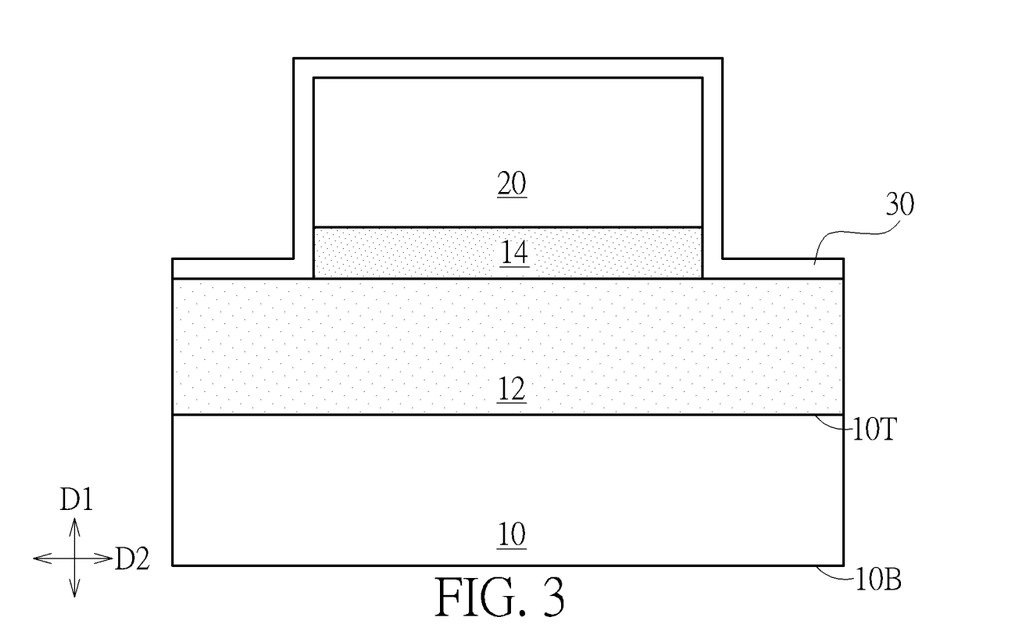
FIG. 3 is a schematic drawing in a step subsequent to FIG. 2.
Figure 4:
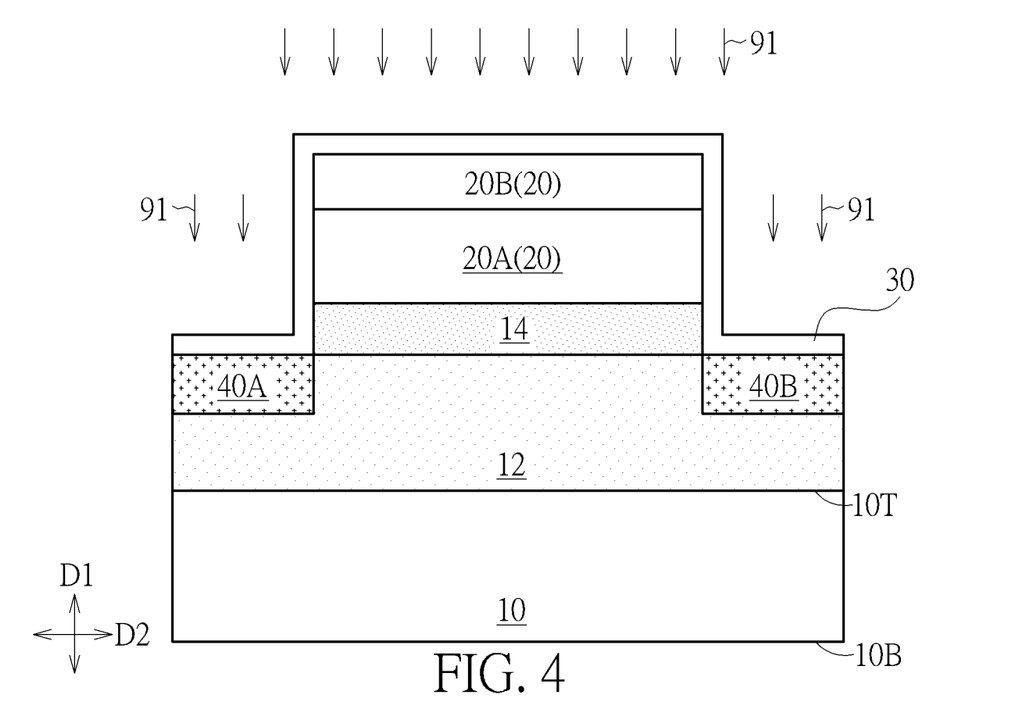
FIG. 4 is a schematic drawing in a step subsequent to FIG. 3.
Figure 5:
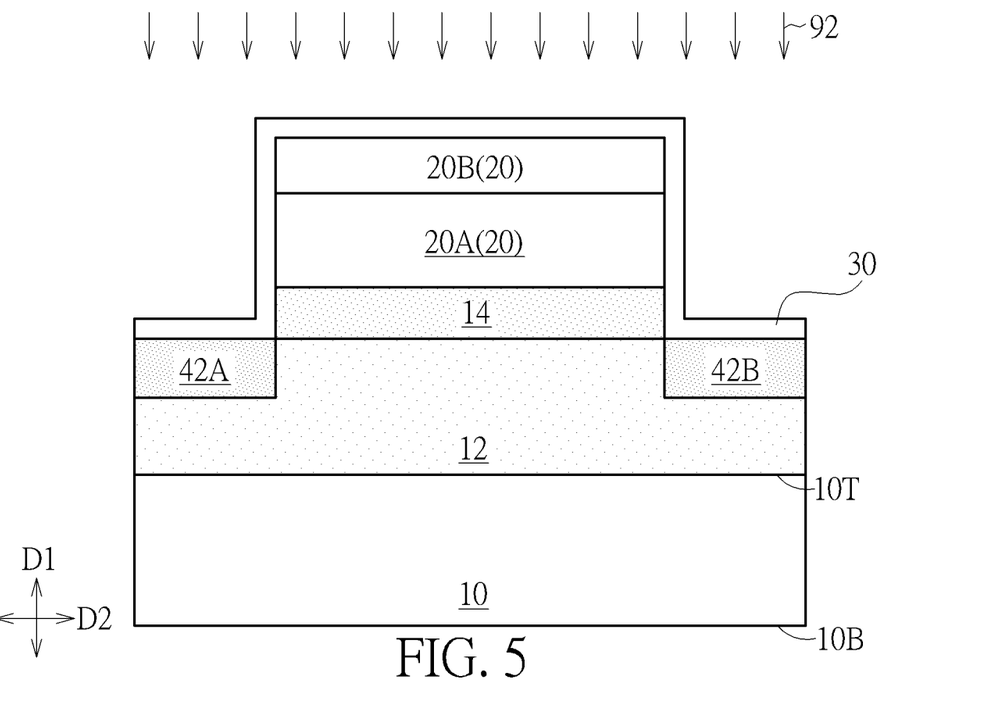
FIG. 5 is a schematic drawing in a step subsequent to FIG. 4.
Figure 6:
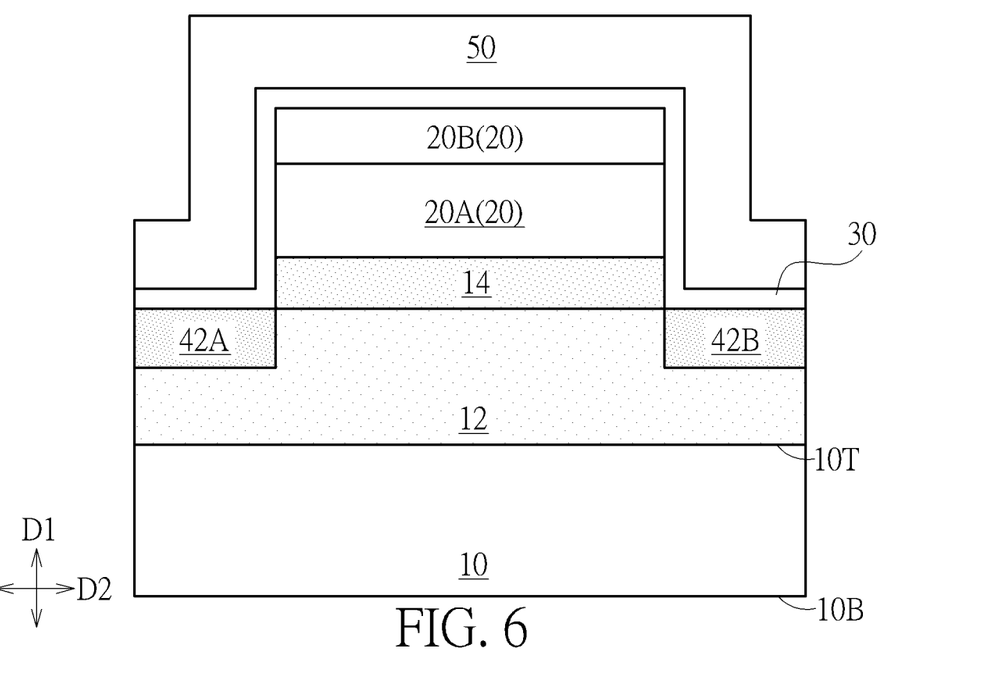
FIG. 6 is a schematic drawing in a step subsequent to FIG. 5.
Figure 7:
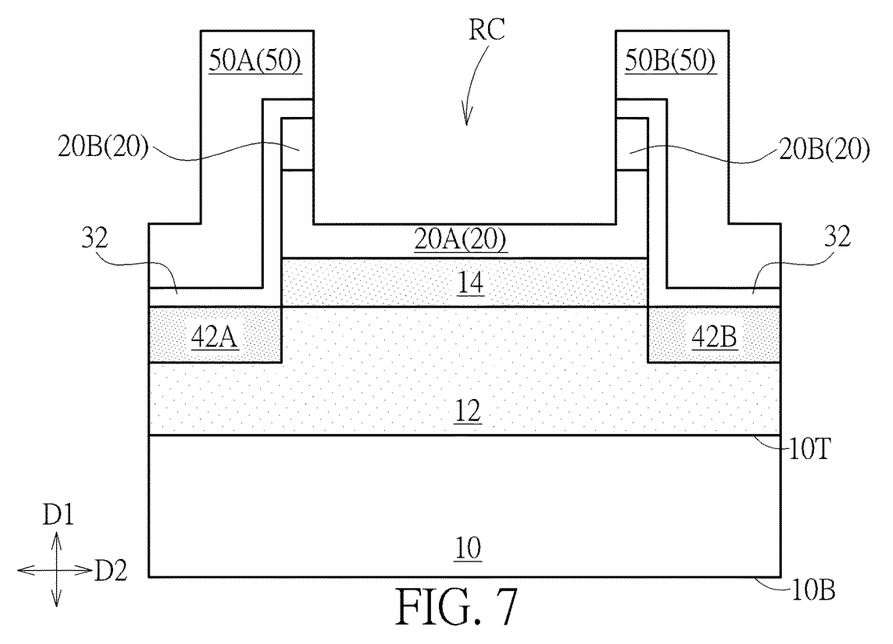
FIG. 7 is a schematic drawing in a step subsequent to FIG. 6.
Figure 8:
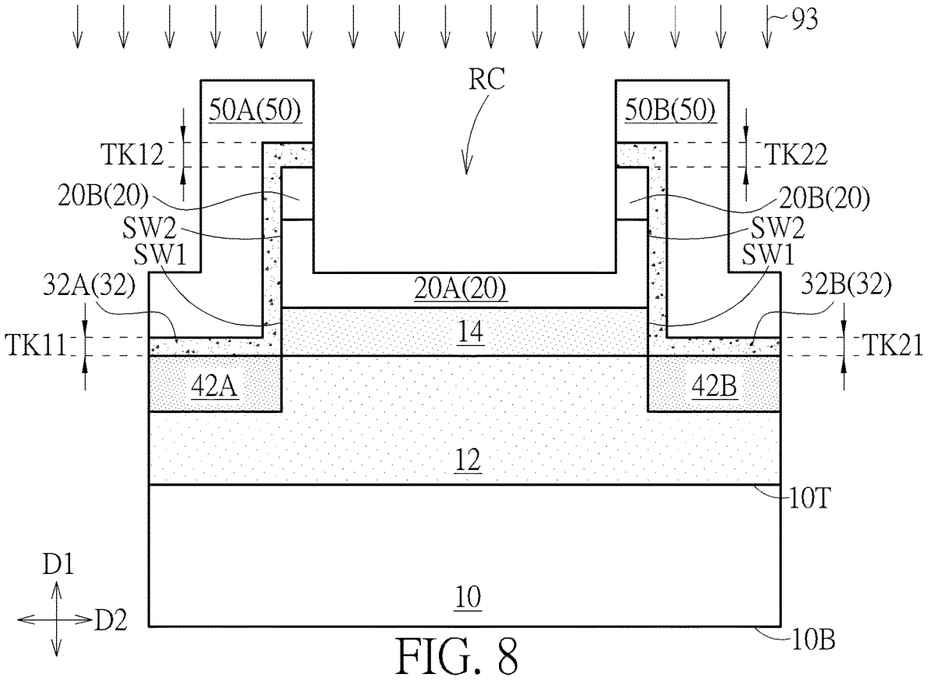
FIG. 8 is a schematic drawing in a step subsequent to FIG. 7.

Please refer to FIGS. 1-9. FIGS. 1-9 are schematic drawings illustrating a manufacturing method of a semiconductor device according to a first embodiment of the present invention. The manufacturing method of the semiconductor device in this embodiment includes the following steps. As shown in FIG. 3, a III-V compound barrier layer 14 is formed on a III-V compound semiconductor layer 12, and a passivation layer 20 is formed on the III-V compound barrier layer 14. A silicon layer 30 is then formed on the passivation layer 20, the III-V compound barrier layer 14, and the III-V compound semiconductor layer 12. Subsequently, as shown in FIG. 4 and FIG. 5, a silicon implantation process 91 is performed to the III-V compound semiconductor layer 12 for forming a source doped region 42A and a drain doped region 42B in the III-V compound semiconductor layer 12 under the silicon layer 30. As shown in FIG. 6 and FIG. 7, a source electrode 50A and a drain electrode 50B are then formed on the silicon layer 30. Subsequently, as shown in FIG. 8, a source silicide layer 32A is formed between the source electrode 50A and the source doped region 42A and a drain silicide layer 32B is formed between the drain electrode 50B and the drain doped region 42B. The source silicide layer 32A and the drain silicide layer 32B are partly formed on the passivation layer 20.

Specifically, in some embodiments, the semiconductor device 101 may further include a substrate 10, and the substrate 10 may have a top surface 10T and a bottom surface 10B opposite to the top surface 10T in a vertical direction (such as a first direction DD. The III-V compound semiconductor layer 12, the III-V compound barrier layer 14, and the passivation layer 20 described above may be formed at a side of the top surface 10T. In addition, the substrate 10 may include a silicon substrate, a silicon carbide (SiC) substrate, a gallium nitride (GaN) substrate, a sapphire substrate, or a substrate made of other suitable materials. In some embodiments, the semiconductor device 101 may further include a buffer layer (not illustrated) disposed between the substrate 10 and the III-V compound semiconductor layer 12 in the first direction D1, and the buffer layer may include gallium nitride, aluminum gallium nitride (AlGaN), aluminum indium nitride (AlInN), or other suitable buffer materials, but not limited thereto.

In some embodiments, the first direction D1 described above may be regarded as a thickness direction of the substrate 10, and a horizontal direction substantially orthogonal to the first direction D1 (such as a second direction D2 other directions orthogonal to the first direction D1) may be substantially parallel with the top surface 10T and/or the bottom surface 10B of the substrate 10, but not limited thereto. In this description, a distance between the bottom surface 10B of the substrate 10 and a relatively higher location and/or a relatively higher part in the vertical direction (such as the first direction D1) may be greater than a distance between the bottom surface 10B of the substrate 10 and a relatively lower location and/or a relatively lower part in the first direction D1. The bottom or a lower portion of each component may be closer to the bottom surface 10B of the substrate 10 in the first direction D1 than the top or upper portion of this component. Another component disposed above a specific component may be regarded as being relatively far from the bottom surface 10B of the substrate 10 in the first direction D1, and another component disposed under a specific component may be regarded as being relatively closer to the bottom surface 10B of the substrate 10 in the first direction D1.

The manufacturing method in this embodiment may include but is not limited to the following steps. Firstly, as shown in FIG. 1, the III-V compound semiconductor layer 12, the III-V compound barrier layer 14, and the passivation layer 20 may be sequentially formed on the substrate 10. In some embodiments, the III-V compound semiconductor layer 12 may include gallium nitride, indium gallium nitride (InGaN), or other suitable III-V compound semiconductor materials. The III-V compound barrier layer 14 may include aluminum gallium nitride, aluminum indium nitride, aluminum gallium indium nitride (AlGaInN), aluminum nitride (AlN), or other suitable III-V compound materials. The passivation layer 20 may include silicon oxide, silicon nitride, tetraethoxy silane (TEOS), or other suitable insulation materials.

Subsequently, as shown in FIG. 2, a patterning process may be performed to the passivation layer 20 and the III-V compound barrier layer 14 for exposing a part of the III-V compound semiconductor layer 12. In some embodiments, the position of the removed passivation layer 20 and the removed III-V compound barrier layer 14 may be located corresponding to the position for forming the source doped region and the drain doped region subsequently. Additionally, in some embodiments, the III-V compound barrier layer 14 at the location corresponding to the source doped region and the drain doped region subsequently formed may not be removed completely, or a thickness of the III-V compound semiconductor layer 12 at the location corresponding to the source doped region and the drain doped region subsequently formed may be less than a thickness of other sections of the III-V compound semiconductor layer 12, but not limited thereto. As shown in FIG. 3, the silicon layer 30 may then be formed covering the exposed III-V compound semiconductor layer 12, the III-V compound barrier layer 14, and the passivation layer 20. In some embodiments, the silicon layer 30 may be formed conformally on a top surface of the III-V compound semiconductor layer 12, a sidewall of the III-V compound barrier layer 14, and a sidewall and a top surface of the passivation layer 20. In addition, the silicon layer 30 may be a pure silicon layer, such as a single crystal silicon layer, a polycrystalline silicon layer, an amorphous silicon layer, or a silicon layer with other structures, but not limited thereto.

As shown in FIG. 4 and FIG. 5, the silicon layer 30 may cover the passivation layer 20, the III-V compound barrier layer 14, and the III-V compound semiconductor layer 12 in the silicon implantation process 91. In some embodiments, a first silicon-rich region 40A and a second silicon-rich region 40B may be formed in the III-V compound semiconductor layer 12 under the silicon layer 30 by the silicon implantation process 91, and an annealing process 92 may be carried out after the silicon implantation process 92 for converting the first silicon-rich region 40A into the source doped region 42A and converting the second silicon-rich region 40B into the drain doped region 42B. In other words, after the silicon implantation process 91, the first silicon-rich region 40A and the second silicon-rich region 40B may include silicon and the original material of the III-V compound semiconductor layer 12, and a concentration of silicon in the first silicon-rich region 40A and a concentration of silicon in the second silicon-rich region 40B may be higher than a concentration of silicon in other regions of the III-V compound semiconductor layer 12. In addition, the silicon in the first silicon-rich region 40A and the second silicon-rich region 40B may be activated by the high temperature environment of the annealing process 92. Therefore, the first silicon-rich region 40A and the second silicon-rich region 40B may be converted into the source doped region 42A and the drain doped region 42B by the annealing process, respectively, and the source doped region 42A and the drain doped region 42B may be regarded as silicon doped regions.

It is worth noting that the control over the first silicon-rich region 40A and the second silicon-rich region 40B may be improved and/or the damage to the surface of the III-V compound semiconductor layer 12 and/or the surface of the III-V compound barrier layer 14 in the silicon implantation process 91 may be reduced because of the silicon layer 30 covering the III-V compound semiconductor layer 12 and/or the III-V compound barrier layer 14 in the silicon implantation process 91, and that is beneficial for process control and/or manufacturing yield. In some embodiments, after the silicon implantation process 91, the passivation layer 20 may include a first region 20A and a second region 20B. The second region 20B may be located on the first region 20A in the first direction D1, and a silicon concentration of the second region 20B (i.e. a concentration of silicon in the second region 20B) may be higher than a silicon concentration of the first region 20A (i.e. a concentration of silicon in the first region 20A). In other words, the second region 20B may be regarded as a silicon-rich region, and the silicon-rich region may be formed in the passivation layer 20 by the silicon implantation process 91.

As shown in FIGS. 5-7, after the step of forming the source doped region 42A and the drain doped region 42B, the source electrode 50A and the drain electrode 50B may be formed on the silicon layer 30. In some embodiments, the method of forming the source electrode 50A and the drain electrode 50B may include forming an electrically conductive material 50 on the silicon layer 30 and forming a recess RC exposing the passivation layer 20 by removing a part of the electrically conductive material 50, a part of the silicon layer 30, and a part of the passivation layer 20. In the step of forming the recess RC, a portion of the electrically conductive material 50 may be removed, and the electrically conductive material 50 remaining after the step of forming the recess RC may become the source electrode 50A and the drain electrode 50B separated from each other. In some embodiments, the electrically conductive material 50 may include a single layer or multiple layers of electrically conductive metallic materials, such as aluminum, tantalum, molybdenum, titanium, or other suitable electrically conductive metallic materials. For instance, the electrically conductive material 50 may include a stacked structure formed with titanium, aluminum, and titanium nitride, but not limited thereto. In addition, the recess RC may penetrate through the electrically conductive material 50, the silicon layer 30, and the second region 20B of the passivation layer 20 in the first direction D1, and the recess RC may not penetrate through the first region 20A of the passivation layer 20, but not limited thereto.

As shown in FIG. 7 and FIG. 8, after the recess RC, the source electrode 50A, and the drain electrode 50B are formed, the source silicide layer 32A and the drain silicide layer 32B described above may be formed. In some embodiments, a part of the source electrode 50A and at least a part of the silicon layer 30 under the source electrode 50A may be converted into the source silicide layer 32A via a thermal process 93, and a part of the drain electrode 50B and at least a part of the silicon layer 30 under the drain electrode 50B may be converted into the drain silicide layer 32B via the thermal process 93. Therefore, the source silicide layer 32A and the drain silicide layer 32B may be silicide of a metal component in the electrically conductive material 50 (such as the bottom metal material), such as titanium silicide ($TiSi_x$), but not limited thereto. In addition, the thermal process 93 may include a high temperature annealing process, such as a high temperature annealing process with process temperature above 570 degrees Celsius, but not limited thereto.

In some embodiments, the source silicide layer 32A and the drain silicide layer 32B may be formed on the source doped region 42A and the drain doped region 42B, respectively, and the source silicide layer 32A and the drain silicide layer 32B may be formed on a sidewall SW1 of the III-V compound barrier layer 14, a sidewall SW2 of the passivation layer 20, and a top surface of the passivation layer 20. In other words, the source silicide layer 32A and the drain silicide layer 32B may be partly formed on the top surface of the second region 20B. In some embodiments, when the passivation layer 20 itself contains silicon, a thickness of a silicide layer 32 formed on the second region 20B may be greater than a thickness of the silicide layer 32 formed on the source doped region or a thickness of the silicide layer 32 formed on the drain doped region. Therefore, a thickness TK12 of the source silicide layer 32A formed on the second region 20B may be greater than a thickness TK11 of the source silicide layer 32A formed on the source doped region 42A, and a thickness TK22 of the drain silicide layer 32B formed on the second region 20B may be greater than a thickness TK21 of the drain silicide layer 32B formed on the drain doped region 42B, but not limited thereto.

Figure 9:
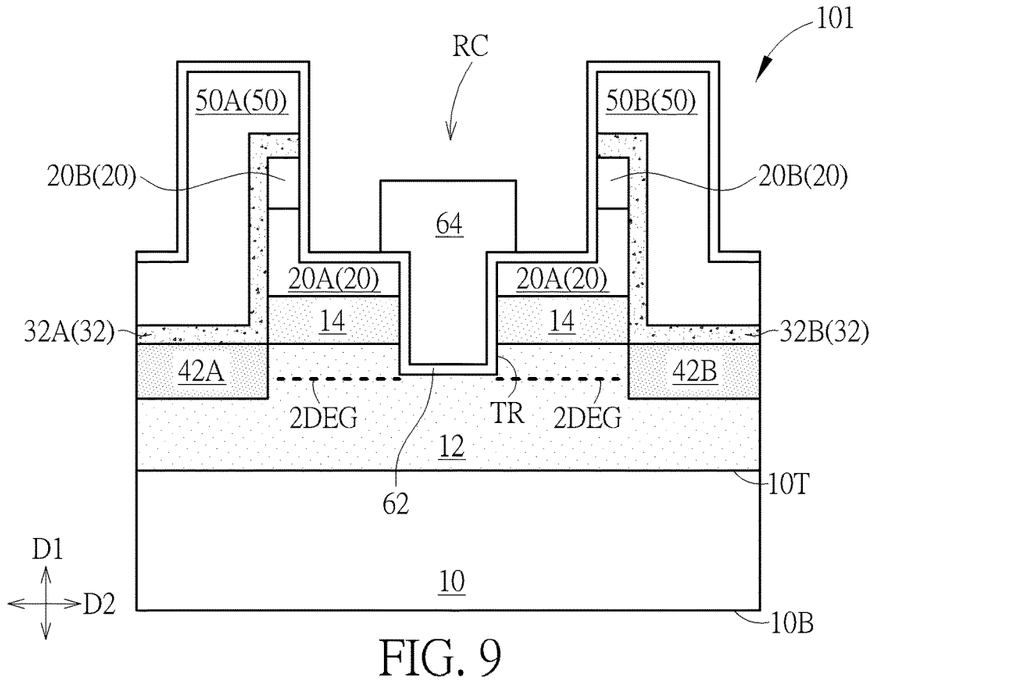
FIG. 9 is a schematic drawing in a step subsequent to FIG. 8.

As shown in FIG. 8 and FIG. 9, after the step of forming the source silicide layer 32A and the drain silicide layer 32B, a gate electrode 64 may be formed above the III-V compound semiconductor layer 12. In some embodiments, before the step of forming the gate electrode 64, a gate trench TR may be formed. The gate trench TR may penetrate through the passivation layer 20 (such as the first region 20A of the passivation layer 20) and the III-V compound barrier layer 14 in the first direction D1, and the gate trench TR may be partly located in the III-V compound semiconductor layer 12. Subsequently, a gate dielectric layer 62 may be formed, and the gate electrode 64 may be formed on the gate dielectric layer 62. At least a part of the gate electrode 64 and at least a part of the gate dielectric layer 62 may be formed in the gate trench TR. The material of the gate dielectric layer 62 may include aluminum nitride, silicon nitride (such as $Si_3N_4$), silicon oxide (such as $SiO_2$), aluminum oxide (such as $Al_2O_3$), hafnium oxide (such as $HfO_2$), lanthanum oxide (such as $La_2O_3$), lutetium oxide (such as $Lu_2O_3$), lanthanum lutetium oxide (such as $LaLuO_3$), or other appropriate dielectric materials. The material of the gate electrode 64 may include electrically conductive metallic materials or other suitable electrically conductive non-metallic materials. The electrically conductive metallic materials mentioned above may include gold, tungsten, cobalt, nickel, titanium, molybdenum, copper, aluminum, tantalum, palladium, platinum, a compound of the above-mentioned materials, a stack layer of the above-mentioned materials, or an alloy of the above-mentioned materials. Additionally, in some embodiments, the gate dielectric layer 62 may further formed conformally on the inner wall of the recess RC and conformally formed on the source electrode 50A and the drain electrode 50B, and the gate electrode 64 may be partly formed in the gate trench TR and partly formed on the gate dielectric layer 62 outside the gate trench TR, but not limited thereto.

The semiconductor device 101 illustrated in FIG. 9 may be formed by the manufacturing method described above. The semiconductor device 101 includes the III-V compound semiconductor layer 12, the III-V compound barrier layer 14, the passivation layer 20, the source doped region 42A, the drain doped region 42B, the source electrode 50A, the drain electrode 50B, the source silicide layer 32A, and the drain silicide layer 32B. The III-V compound barrier layer 14 is disposed on the III-V compound semiconductor layer 12. The passivation layer 20 is disposed on the III-V compound barrier layer 14, and the passivation layer 20 includes the first region 20A and the second region 20B. The second region 20B is located above the first region 20A, and the silicon concentration of the second region 20B is higher than the silicon concentration of the first region 20A. The source doped region 42A and the drain doped region 42B are disposed in the III-V compound semiconductor layer 12. The source electrode 50A and the drain electrode 50B are disposed on the source doped region 42A and the drain doped region 42B, respectively. The source silicide layer 32A is disposed between the source electrode 50A and the source doped region 42A, and the drain silicide layer 32B is disposed between the drain electrode 50B and the drain doped region 42B. The source silicide layer 32A and the drain silicide layer 32B are further disposed partly on the passivation layer 20.

In some embodiments, the semiconductor device 101 may further include the substrate 10, the recess RC, the gate trench TR, the gate dielectric layer 62, and the gate electrode 64 described above, and the semiconductor devise 101 may be regarded as a transistor structure, such as a high electron mobility transistor (HEMT), but not limited thereto. In the semiconductor device 101, the gate trench TR may penetrate through the passivation layer 20 (such as the first region 20A of the passivation layer 20) and the III-V compound barrier layer 14 for being partly disposed in the III-V compound semiconductor layer 12. The gate electrode 64 may be disposed on the III-V compound semiconductor layer 12 and the gate dielectric layer 62, and at least a part of the gate electrode 64 and at least a part of the gate dielectric layer 62 may be disposed in the gate trench TR. In addition, the source silicide layer 32A and the drain silicide layer 32B may be partly disposed on the source doped region 42A and the drain doped region 42B, respectively, and the source silicide layer 32A and the drain silicide layer 32B may be further partly disposed on the sidewall SW1 of the III-V compound barrier layer 14, the sidewall SW2 of the passivation layer 20, and the top surface of the second region 20B of the passivation layer 20. In some embodiments, the thickness of the source silicide layer 32A disposed on the second region 20B may be greater than the thickness of the source silicide layer 32A disposed on the source doped region 42A, and the thickness of the drain silicide layer 32B disposed on the second region 20B may be greater than the thickness of the drain silicide layer 32B disposed on the drain doped region 42B, but not limited thereto.

In the semiconductor device 101, two-dimensional electron gas 2DEG may be formed between the gate trench TR and the source doped region 42A and formed between the gate trench TR and the drain doped region 42B by controlling the depth of the gate trench TR, and the gate electrode 64 formed in the gate trench TR may be used to reduce leakage current of the semiconductor device 101, but not limited thereto. The source silicide layer 32A and the drain silicide layer 32B may be used to lower the contact resistance between the source electrode 50A and the source doped region 42A and the contact resistance between the drain electrode 50B and the drain doped region 42B. The on-resistance of the semiconductor device 101 may be lowered and the related electrical performance may be enhanced accordingly. In addition, the silicon layer for forming the source silicide layer 32A and the drain silicide layer 32B may be used to provide protection effect and/or improve the control over the source doped region 42A and the drain doped region 42B in the silicon implantation process configured for forming the source doped region 42A and the drain doped region 42B. The purposes of process simplification and/or manufacturing yield improvement may be achieved accordingly.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 10:
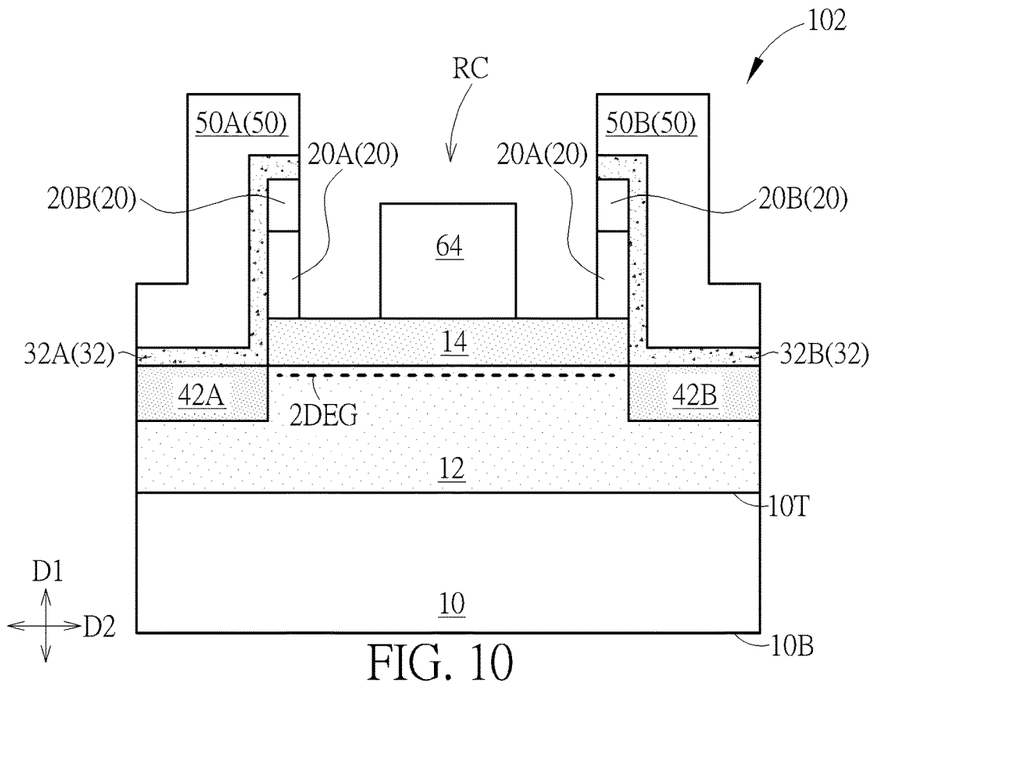
FIG. 10 is a schematic drawing illustrating a semiconductor device according to a second embodiment of the present invention.

Please refer to FIG. 10. FIG. 10 is a schematic drawing illustrating a semiconductor device 102 according to a second embodiment of the present invention. As shown in FIG. 10, in the semiconductor device 102, the recess RC may penetrate through the passivation layer 20 and expose the III-V compound barrier layer 14 in the first direction D1. The gate electrode 64 may be disposed on the III-V compound semiconductor layer 12 and the III-V compound barrier layer 14 and located in the recess RC, and the gate electrode 64 may be separated from the inner sidewall of the recess RC in the second direction D2, but not limited thereto. Additionally, in some embodiments, the gate electrode 64 may include a p-type doped III-V compound, such as p-type doped aluminum gallium nitride, p-type doped gallium nitride, or other suitable p-type doped III-V compound materials. In addition, the p-type dopant in the p-type doped III-V compound may include cyclopentadienyl magnesium (Cp$_2$Mg), magnesium, beryllium (Be), zinc (Zn), a combination of the materials described above, or other suitable p-type dopants.

Figure 11:
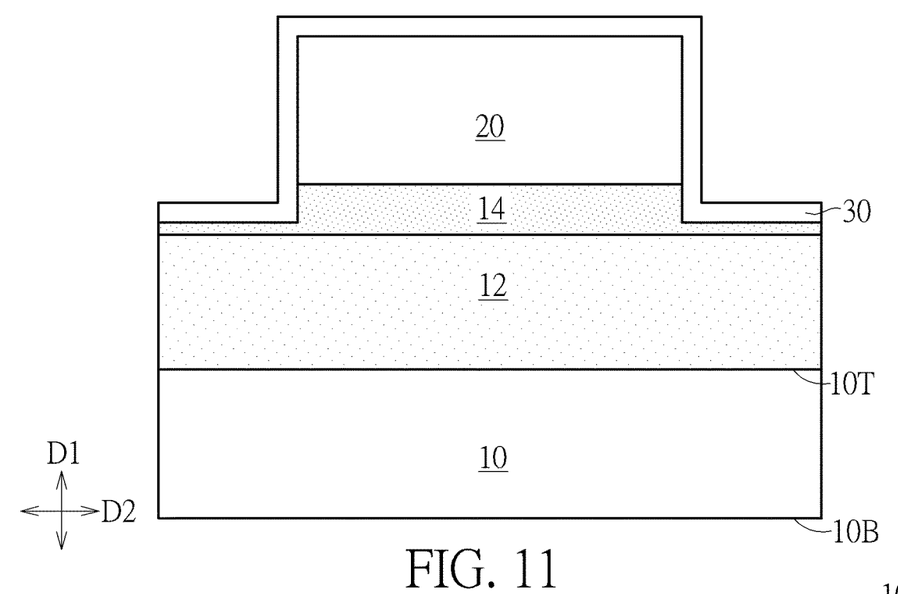
Figure 12:
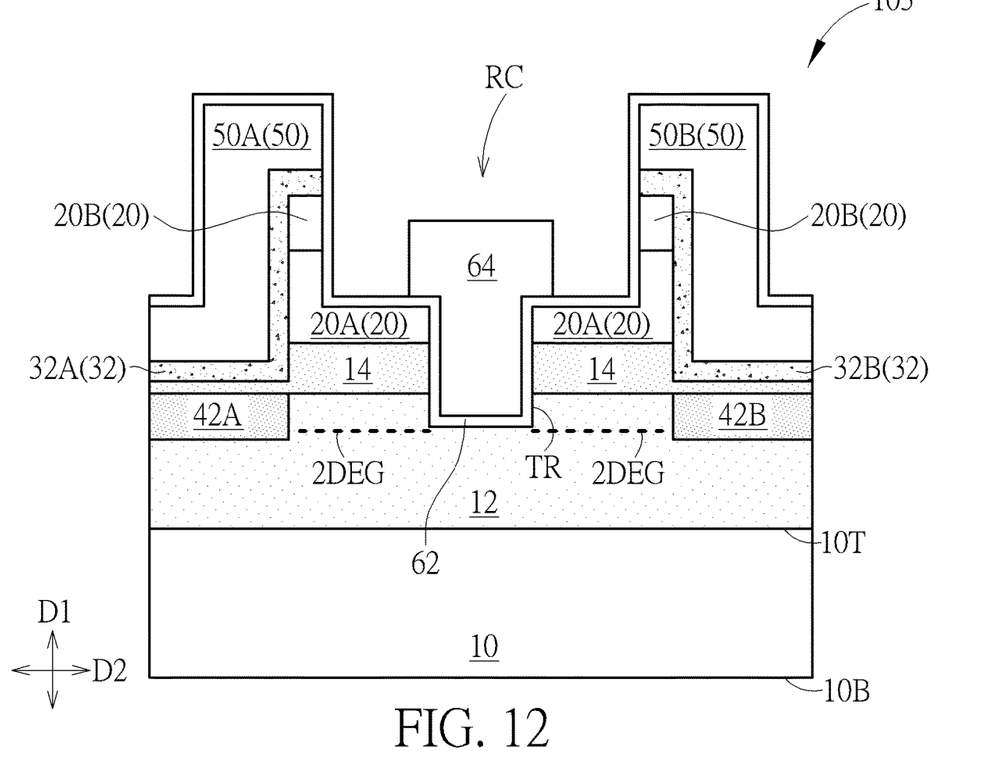
FIG. 12 is a schematic drawing in a step subsequent to FIG. 11.

Please refer to FIG. 11 and FIG. 12. FIG. 11 and FIG. 12 are schematic drawings illustrating a manufacturing method of a semiconductor device 103 according to a third embodiment of the present invention, wherein FIG. 12 is a schematic drawing in a step subsequent to FIG. 11. As shown in FIG. 11, in some embodiments, the III-V compound barrier layer 14 at the location corresponding to the source doped region and the drain doped region subsequently formed may not be removed completely. Therefore, the silicon layer may not be in direct contact with the III-V compound semiconductor layer 12, and a part of the III-V compound barrier layer 14 may be located between the silicon layer 30 and the III-V compound semiconductor layer 12 in the first direction D1. Accordingly, as shown in FIG. 12, in the semiconductor device 103, a part of the III-V compound barrier layer 14 may be located between the source silicide layer 32A and the source doped region 42A in the first direction D1, and a part of the III-V compound barrier layer 14 may be located between the drain silicide layer 32B and the drain doped region 42B in the first direction D1. The thickness of the III-V compound barrier layer 14 located between the source silicide layer 32A and the source doped region 42A and the thickness of the III-V compound barrier layer 14 located between the drain silicide layer 32B and the drain doped region 42B may be less than the thickness of the III-V compound barrier layer 14 located between the passivation layer 20 and the III-V compound semiconductor layer 12 in the first direction D1, but not limited thereto.

Figure 13:
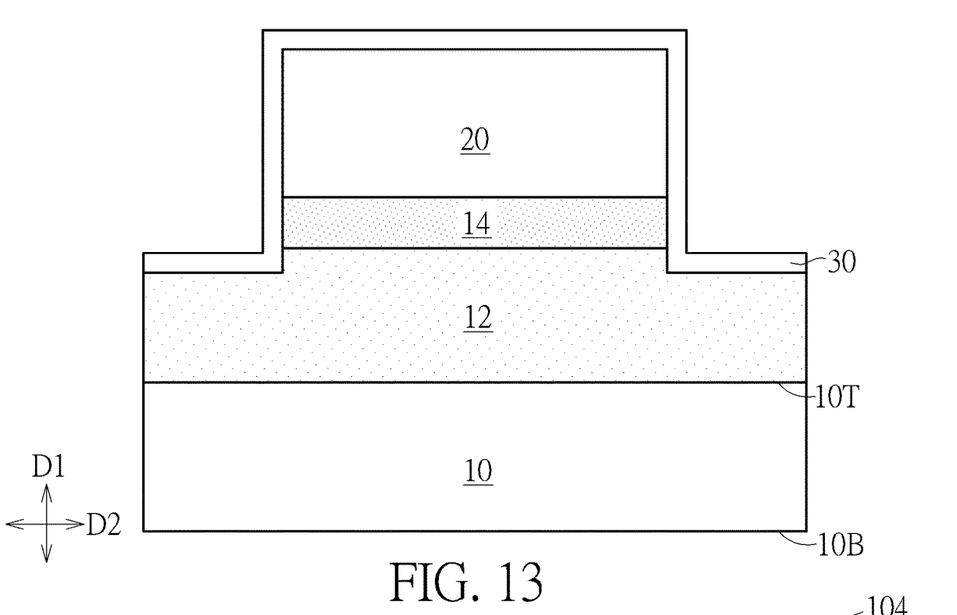
Figure 14:
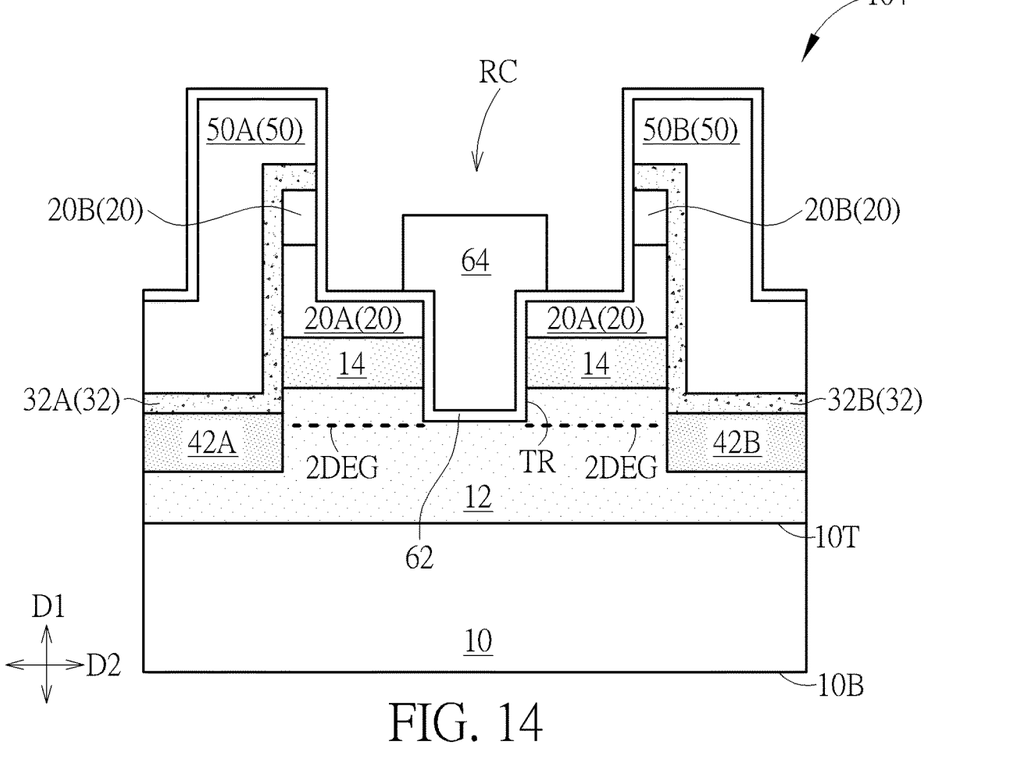
FIG. 14 is a schematic drawing in a step subsequent to FIG. 13.

Please refer to FIG. 13 and FIG. 14. FIG. 13 and FIG. 14 are schematic drawings illustrating a manufacturing method of a semiconductor device 104 according to a fourth embodiment of the present invention, wherein FIG. 14 is a schematic drawing in a step subsequent to FIG. 13. As shown in FIG. 13, in some embodiments, the thickness of the III-V compound semiconductor layer 12 at the location corresponding to the source doped region and the drain doped region subsequently formed may be less than the thickness of other sections of the III-V compound semiconductor layer 12, and the top surface of the III-V compound semiconductor layer 12 directly contacting the silicon layer 30 may be lower than the interface between the III-V compound semiconductor layer 12 and the III-V compound barrier layer 14 in the first direction D1. Therefore, as shown in FIG. 14, in the semiconductor device 104, the interface between the source silicide layer 32A and the source doped region 42A may be lower than the interface between the III-V compound semiconductor layer 12 and the III-V compound barrier layer 14 in the first direction D1, and the interface between the drain silicide layer 32B and the drain doped region 42B may be lower than the interface between the III-V compound semiconductor layer 12 and the III-V compound barrier layer 14 in the first direction D1.

To summarize the above descriptions, in the semiconductor device and the manufacturing method thereof according to the present invention, the silicon layer for forming the source silicide layer and the drain silicide layer may be used to provide protection effect and/or improve the control over the source doped region and the drain doped region in the silicon implantation process configured for forming the source doped region and the drain doped region. The purposes of process simplification and/or manufacturing yield improvement may be achieved accordingly. In addition, the source silicide layer and the drain silicide layer may be used to lower the contact resistance between the source electrode and the source doped region and the contact resistance between the drain electrode and the drain doped region. The on-resistance of the semiconductor device may be lowered and the related electrical performance may be enhanced accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
a III-V compound semiconductor layer;
a III-V compound barrier layer disposed on the III-V compound semiconductor layer;
a passivation layer disposed on the III-V compound barrier layer, wherein the passivation layer comprises:
a first region; and
a second region located above the first region, wherein a silicon concentration of the second region is higher than a silicon concentration of the first region;
a source doped region and a drain doped region disposed in the III-V compound semiconductor layer;
a source electrode and a drain electrode disposed on the source doped region and the drain doped region, respectively;
a source silicide layer disposed between the source electrode and the source doped region;
a drain silicide layer disposed between the drain electrode and the drain doped region, wherein the source silicide layer and the drain silicide layer are further disposed partly on the first region and the second region of the passivation layer;
a gate electrode disposed on the III-V compound semiconductor layer; and
a gate dielectric layer disposed between the gate electrode and the III-V compound semiconductor layer,
wherein the source silicide layer and the drain silicide layer are partly disposed on a top surface of the second region.
2. The semiconductor device according to claim 1, wherein the source silicide layer and the drain silicide layer are partly disposed on a sidewall of the III-V compound barrier layer, a sidewall of the first region of the passivation layer, and a sidewall of the second region of the passivation layer.
3. The semiconductor device according to claim 1, wherein a thickness of the source silicide layer disposed on the second region is greater than a thickness of the source silicide layer disposed on the source doped region, and a thickness of the drain silicide layer disposed on the second region is greater than a thickness of the drain silicide layer disposed on the drain doped region.
4. The semiconductor device according to claim 1, wherein the source doped region and the drain doped region are silicon doped regions.
5. The semiconductor device according to claim 1, further comprising:
a gate trench penetrating through the passivation layer and the III-V compound barrier layer, wherein at least a part of the gate electrode is disposed in the gate trench.

* * * * *